United States Patent
Takahashi et al.

(10) Patent No.: US 6,759,887 B2
(45) Date of Patent: Jul. 6, 2004

(54) MIXER CIRCUIT

(75) Inventors: Yoshinori Takahashi, Hyogo (JP); Hiroyuki Joba, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/450,819

(22) PCT Filed: Jul. 12, 2001

(86) PCT No.: PCT/JP01/06062
§ 371 (c)(1), (2), (4) Date: Jun. 18, 2003

(87) PCT Pub. No.: WO03/009465
PCT Pub. Date: Jan. 30, 2003

(65) Prior Publication Data
US 2004/0027187 A1 Feb. 12, 2004

(51) Int. Cl.⁷ .................................. G06F 7/44
(52) U.S. Cl. ........................ 327/359; 327/65
(58) Field of Search ............ 327/65–67, 356–359; 455/326

(56) References Cited
U.S. PATENT DOCUMENTS
5,936,466 A * 8/1999 Andoh et al. ............ 330/253
6,631,257 B1 * 10/2003 White et al. ............ 455/333

FOREIGN PATENT DOCUMENTS

| JP | 2-190011 | 7/1990 |
| JP | 10-224152 | 8/1998 |
| JP | 2000-101353 | 4/2000 |

* cited by examiner

Primary Examiner—Kenneth B. Wells
(74) Attorney, Agent, or Firm—Oblon, Spivak, McClelland, Maier & Neustadt, P.C.

(57) ABSTRACT

A mixer circuit includes a local frequency multiplication unit including a pair of transistors having bases receiving local oscillation waves inverted in phase. A reference transistor is differentially connected with the pair of transistors. The pair of transistors and the reference transistor have their emitters connected to a collector of a modulated wave input transistor having a base receiving a modulated wave signal and an emitter connected to a constant current source, and have their collectors connected to a load. The commonly connected collectors of the pair of transistors and the collector of the reference transistor output modulation signals inverted in phase. The sum of currents flowing through the pair of transistors and the reference transistor equals the constant current of the constant current source flowing through the modulated wave input transistor, and the mixer circuit has a gain.

5 Claims, 3 Drawing Sheets

MIXER CIRCUIT

TECHNICAL FIELD

The present invention relates generally to mixer circuits and particularly to a direct conversion mixer for use in mobile communications.

BACKGROUND ART

A direct conversion system is known which converts a signal modulated into a radio frequency directly to a baseband signal and modulates a baseband directly to a radio frequency. Generally, this system does not provide an intermediate frequency. As such, it can dispense with image suppression, reduce spurious source, an d simplify a system advantageously. It is also known, however, that the system provides 2nd order intermodulation distortion, local oscillation wave noise, and other similar disadvantages. One approach to alleviate these disadvantages is an even harmonics mixer such as an anti-parallel diode.

In recent years there is a demand for miniature and inexpensive ICs for high-frequency radio communications, as represented for example by mobile phones. In such a market, current consumption reduction, IC yields and the like are important issues.

In an even harmonics mixer, a mixer circuit itself does not consume a current. To operate the mixer circuit, however, a high local oscillation wave input level is required. Accordingly, overall current consumption reduction has been an issue to be addressed. Furthermore there is also a demand for reducing an influence of semiconductor process variation.

As an approach to overcome such disadvantages, a system using a transistor's diode characteristics has been considered in recent years.

FIG. 5 is a circuit diagram showing one example of a conventional even harmonics mixer using transistors. As shown in the figure, transistors 1 and 2 have their respective collectors connected together and their respective emitters connected together to configure a local frequency multiplication unit. A resistor R1 is connected between the collectors and a power supply and a resistor R2 is connected between the emitters and ground. Transistors 1 and 2 receive a modulated wave signal BB at their respective emitters and receive signals LO and ↓LO ("↓" indicates an inverted signal) each having a component of a frequency of a local oscillation wave inverted in phase at their respective bases. Thus the local frequency multiplication unit generates a local oscillation wave frequency component multiplied by two and can extract a desired frequency component by multiplying an input signal frequency and the local oscillation wave frequency component.

The mixer of FIG. 5, however, is associated with a small power gain and requires a high local oscillation wave input to operate the local frequency multiplication unit.

DISCLOSURE OF THE INVENTION

A main object of the present invention is therefore to provide in the field of high-frequency radio communications a mixer circuit suitable for applications for which there is a demand for low frequency currents, high IC yields and simplified system configurations.

In accordance with the present invention a mixer circuit includes: a local frequency multiplication unit configured of a first transistor having an input electrode receiving a frequency component of a local oscillation wave signal and a second transistor receiving a signal opposite in phase to the local oscillation wave, the first and second transistors having their respective first electrodes connected together and their respective second electrodes connected together, the local frequency multiplication unit outputting a modulation signal at the first electrode of each transistor; a third transistor connected in a pair with each of the first and second transistors of the local frequency multiplication unit, having an input electrode receiving a reference signal, and a first electrode differentially outputting the modulation signal; a voltage source providing the first, second and third transistors at their respective first electrodes with a predetermined voltage; a signal input unit connected to the first, second and third transistors at their respective second electrodes and receiving a modulated signal; and a constant current source connected to the signal input unit.

Furthermore, the signal input unit is a fourth transistor having an input electrode receiving the modulated signal, a first electrode connected to the second electrode of each of the first, second and third transistors, and a second electrode connected to the constant current source.

Furthermore, there are provided two sets of the local frequency multiplication unit, the third transistor for reference and the fourth transistor, the voltage source is connected to the two local frequency multiplication units commonly, and the constant current source supplies a constant current to the two fourth transistors commonly.

Furthermore, the constant current source is a variable constant current source.

Furthermore, the mixer circuit further includes a variable current source varying a bias current provided to the input electrode of the third transistor.

BEST MODES FOR CARRYING OUT THE INVENTION

Figure 1:
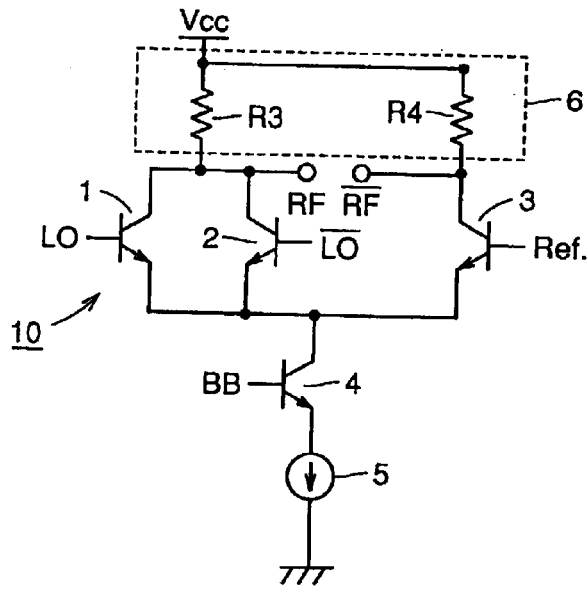
FIG. 1 is a circuit diagram of a mixer circuit of one embodiment of the present invention.
Figure 5:
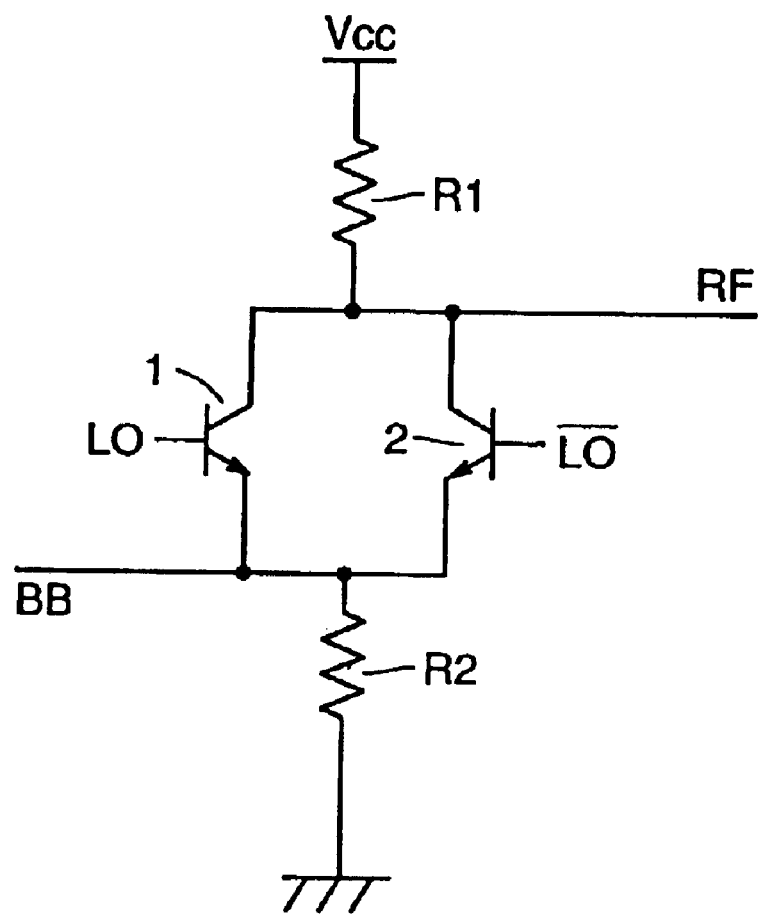
FIG. 5 is a circuit diagram showing one example of an even harmonics mixer using a conventional transistor.

FIG. 1 is a circuit diagram of a mixer circuit of one embodiment of the present invention. In FIG. 1, similarly as shown in the conventional example of FIG. 5, transistors 1 and 2 have their respective collectors connected together and their respective emitters connected together, each collector receiving a power supply via a resister R3, and their respective bases receiving frequency components signals LO and ↓LO of a local oscillation wave to configure a local frequency multiplication unit 10. Local frequency multiplication unit 10 generates in a manner similar to that of an even harmonics mixer a frequency corresponding to the local oscillation wave frequency multiplied by two.

Furthermore, a reference transistor 3 has its emitter connected to the emitters of transistors 1 and 2, its collector connected to a power supply via a resistor R4, and its base receiving a bias current Ref.

Resistors R3 and R4 configure a load 6 serving as a voltage source. In place of resistors R3, R4 a different type of load may be connected. Transistors 1, 2 and 3 have their emitters connected to the collector of a transistor 4 for receiving a modulated wave. Transistor 4 has its emitter receiving a constant current from a constant current source 5 and its base receiving a modulated wave signal BB.

In the mixer circuit of FIG. 1, the sum of the current flowing through local frequency multiplication unit 10 configured of transistors 1 and 2 and that flowing through transistor 3 equals that flowing through transistor 4. Furthermore, the current flowing through transistor 4 equals the constant current of constant current source 5. As such by allowing transistor 4 to have a gain a mixer circuit having a gain can be implemented.

The frequency multiplied by two and generated by local frequency multiplication unit 10 configured of transistors 1 and 2 varies the current of local frequency multiplication unit 10. Since transistor 4 provides a constant-current operation relative to local frequency multiplication unit 10 and transistor 3, the variation in current results in transistor 3 having a current of opposite phase flowing therethrough. Transistor 4 has a gain for a modulated wave that is received and the amplified signal is converted in frequency by local frequency multiplication unit 10. The signal converted in frequency is output at load 6 as differential output signals RF and ↓RF.

Thus in the present embodiment a mixer circuit configured of local frequency multiplication unit 10 configured of transistors 1 and 2 and an input unit formed of transistor 4 to receive a modulated wave is provided with reference transistor 3 paired with local frequency multiplication unit 10 to provide a differential mixer. Without increasing an input level of a local oscillation wave a large-gain mixer circuit can be implemented.

Figure 2:
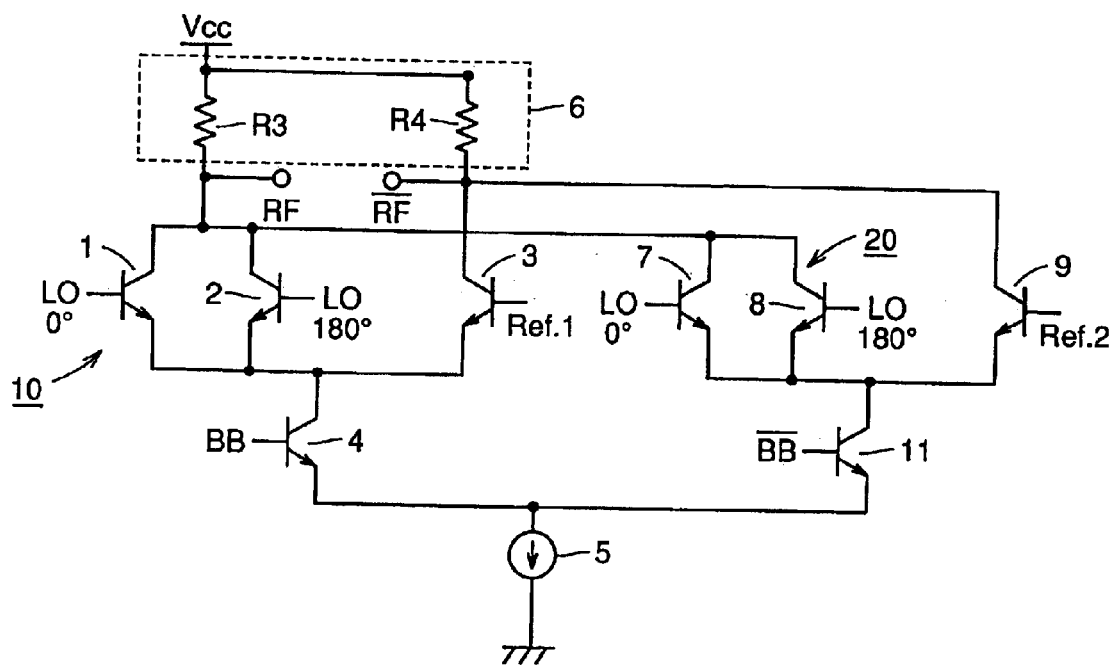
FIG. 2 is a circuit diagram of another embodiment of the present invention.

FIG. 2 is a circuit diagram of another embodiment of present invention. In FIG. 2, local frequency multiplication unit 10 and transistors 3 and 4 are similar in configuration to those shown in FIG. 1. A local frequency multiplication unit 20 and transistors 9, 11 are configured similarly as shown in the mixer circuit of FIG. 1. More specifically, transistors 7 and 8 have their respective collectors connected together, their respective emitters connected together, and their respective bases receiving frequency component signals LO, ↓LO of a local oscillation wave, respectively.

Transistors 7, 8 have their respective emitters connected to the emitter of a reference transistor 9. Reference transistor 9 has its base receiving a bias current. Each transistor 7, 8, 9 has its emitter connected to the collector of a transistor 11 receiving a modulated wave. Transistor 11 has its base receiving a modulated wave signal ↓BB opposite in phase to the modulated wave signal BB input to the base of transistor 4.

Local frequency multiplication unit 20 has its collectors connected to collectors of local frequency multiplication unit 10, and each collector receives a power supply commonly via a resistor R3. Transistor 9 has its collector connected to a collector of transistor 3 and these collectors receive a power supply via a resistor R4. Transistor 11 has its emitter connected to an emitter of transistor 4 and these emitters are connected to constant current source 5 commonly. In other words, the mixer circuit of FIG. 2 corresponds to the mixer circuit of FIG. 1 if the mixer circuit of FIG. 1 has the Gilbert cell configuration.

Thus in the present embodiment each mixer circuit having the same configuration as shown in FIG. 1 can have a large gain, as aforementioned, and it can also realize the Gilbert cell configuration to implement a mixer circuit capable of suppressing a frequency component of a local oscillation wave leaking toward an output.

Figure 3:
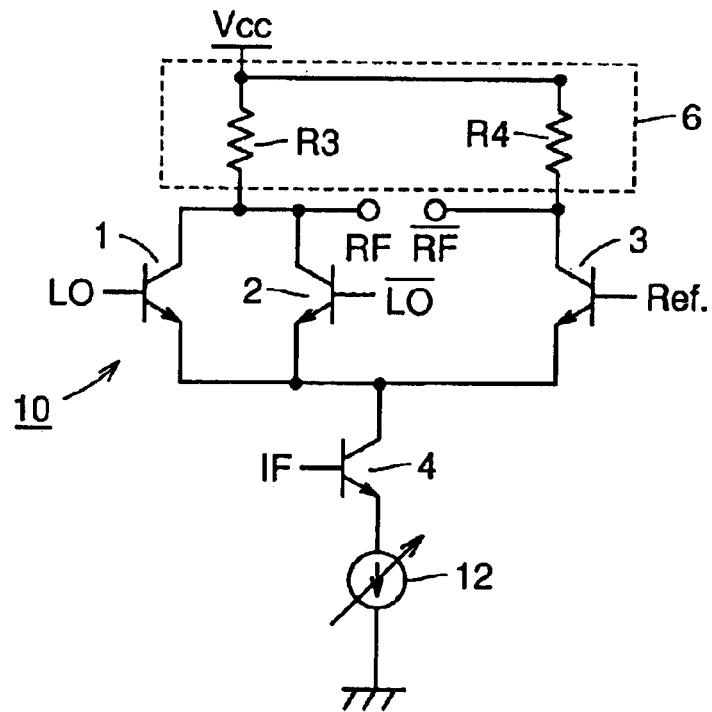
FIG. 3 is circuit diagram showing another embodiment of the present invention.

FIG. 3 is a circuit diagram showing another embodiment of the present invention. In the present embodiment, constant current source 5 shown in FIG. 1 is replaced by a variable current source 12. A variable gain control effect can be obtained.

Figure 4:
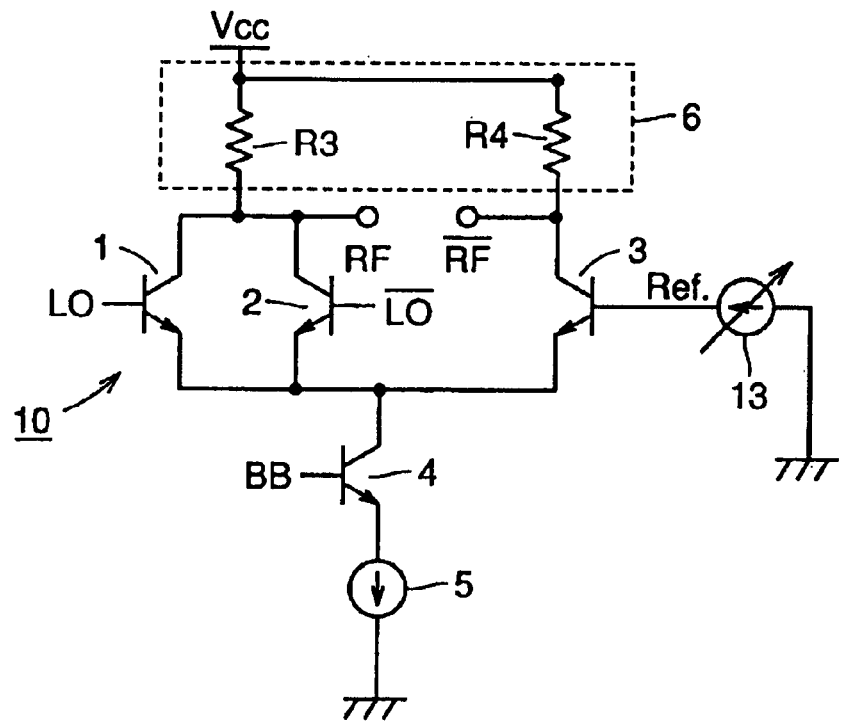
FIG. 4 is a circuit diagram showing still another embodiment of the present invention.

FIG. 4 is a circuit diagram showing still another embodiment of the present invention. In the present embodiment, a variable current source 13 is connected to the base of the reference transistor 3 of FIG. 1 to allow a bias current to be variable. A variable gain control effect can be obtained.

The above embodiments have described a mixer circuit mixing a frequency component of a local oscillation wave and the signal of a modulated wave BB together to output a signal of a modulated wave. The mixer circuit may receive a radio frequency signal having been received as a signal of a modulated wave and mix it with a frequency component of a local oscillation wave, and output a baseband signal as a modulation signal.

Furthermore while the above embodiments are configured of a bipolar transistor, they may be configured of a field effect transistor.

Thus in the present invention a mixer circuit configured of a local frequency multiplication unit and an input unit receiving a modulated wave is provided with a reference transistor to provide a differential mixer thereby to simplify a system configuration with large gain. Furthermore, constant-current control can reduce dependency on semiconductor process variation and providing a constant current source in a bandgap configuration can reduce power supply voltage variation and temperature variation.

INDUSTRIAL APPLICABILITY

In accordance with the present invention a mixer circuit can have both of an advantage of a conventional mixer circuit and that of an even harmonics mixer to allow the even harmonics mixer to be active to implement a large-gain mixer circuit while preventing an influence of a carrier component. It is applicable to mobile communications involving modulation from a baseband signal directly to a radio frequency.

What is claimed is:

1. A mixer circuit comprising:

a local frequency multiplication unit configured of a first transistor having an input electrode receiving a frequency component of a local oscillation wave signal and a second transistor receiving a signal opposite in phase to said local oscillation wave, said first and second transistors having their respective first electrodes connected together and their respective second electrodes connected together, said local frequency multiplication unit outputting a modulation signal at said first electrode of each said transistor;

a third transistor connected in a pair with each of said first and second transistors of said local frequency multiplication unit, having an input electrode receiving a reference signal, and a first electrode differentially outputting said modulation signal;

a voltage source providing said first, second and third transistors at their respective first electrodes with a predetermined voltage;

a signal input unit connected to said first, second and third transistors at their respective second electrodes and receiving a modulated signal; and a constant current source connected to said signal input unit.

2. The mixer circuit according to claim 1, wherein said signal input unit is a fourth transistor having an input electrode receiving said modulated signal, a first electrode connected to said second electrode of each of said first, second and third transistors, and a second electrode connected to said constant current source.

3. The mixer circuit according to claim 1, wherein:

there are provided two sets of said local frequency multiplication unit, said third transistor for reference and said fourth transistor;

said voltage source is connected to said two local frequency multiplication units commonly; and said constant current source supplies a constant current to said two fourth transistors commonly.

4. The mixer circuit according to claim 2, wherein said constant current source is a variable constant current source.

5. The mixer circuit according to claim 1, further comprising a variable current source varying a bias current provided to said input electrode of said third transistor.

\* \* \* \* \*